(12) United States Patent
Liang et al.

(10) Patent No.: US 9,012,963 B2
(45) Date of Patent: Apr. 21, 2015

(54) SEMICONDUCTOR DEVICE

(75) Inventors: Qingqing Liang, Lagrangeville, NY (US); Miao Xu, Beijing (CN); Huilong Zhu, Poughkeepsie, NY (US); Huicai Zhong, San Jose, CA (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 78 days.

(21) Appl. No.: 13/501,518

(22) PCT Filed: Nov. 18, 2011

(86) PCT No.: PCT/CN2011/082425
§ 371 (c)(1),
(2), (4) Date: Apr. 12, 2012

(87) PCT Pub. No.: WO2013/026237
PCT Pub. Date: Feb. 28, 2013

(65) Prior Publication Data
US 2013/0049092 A1  Feb. 28, 2013

(30) Foreign Application Priority Data
Aug. 22, 2011 (CN) .......................... 2011 1 0241218

(51) Int. Cl.
*H01L 29/66* (2006.01)
*H01L 29/786* (2006.01)
*H01L 29/49* (2006.01)

(52) U.S. Cl.
CPC ...... *H01L 29/78654* (2013.01); *H01L 29/4908* (2013.01); *H01L 29/78603* (2013.01); *H01L 29/78648* (2013.01); *H01L 29/78696* (2013.01)

(58) Field of Classification Search
None
See application file for complete search history.

(56) References Cited

U.S. PATENT DOCUMENTS 7,180,135 B1    2/2007 Ioannou et al.
2007/0187769 A1*  8/2007 Anderson et al. ............. 257/369
(Continued)

FOREIGN PATENT DOCUMENTS

CN      1610127 A    4/2005
CN    101331608 A   12/2008
(Continued)

OTHER PUBLICATIONS

International Search Report and Written Opinion for PCT Application No. PCT/CN2011/082425, dated May 31, 2012, 7 pages.

*Primary Examiner* — Davienne Monbleau
*Assistant Examiner* — Shaka White
(74) *Attorney, Agent, or Firm* — Westman, Champlin & Koehler, P.A.

(57) ABSTRACT

The present application discloses a semiconductor device comprising a source region and a drain region in an ultra-thin semiconductor layer; a channel region between the source region and the drain region in the ultra-thin semiconductor layer; a front gate stack above the channel region, the front gate comprising a front gate and a front gate dielectric between the front gate and the channel region; and a back gate stack below the channel region, the back gate stack comprising a back gate and a back gate dielectric between the back gate and the channel region, wherein the front gate is made of a high-Vt material, and the back gate is made of a low-Vt material. According to another embodiment, the front gate and the back gate are made of the same material, and the back gate is applied with a forward bias voltage during operation. The semiconductor device alleviates threshold voltage fluctuation due to varied thickness of the channel region by means of the back gate.

15 Claims, 1 Drawing Sheet

(56) References Cited

U.S. PATENT DOCUMENTS

| | | |
|---|---|---|
| 2008/0111195 A1* | 5/2008 | Atanackovic ................. 257/366 |
| 2010/0054049 A1* | 3/2010 | Yamaoka et al. ........ 365/189.07 |
| 2011/0127608 A1* | 6/2011 | Cheng et al. .................. 257/347 |
| 2012/0211806 A1* | 8/2012 | Werner ......................... 257/263 |

FOREIGN PATENT DOCUMENTS

| | | |
|---|---|---|
| CN | 101582426 A | 11/2009 |
| EP | 0 362 961 A1 | 4/1990 |

* cited by examiner

SEMICONDUCTOR DEVICE

CROSS-REFERENCE TO RELATED APPLICATION

This application is a National Phase application of, and claims priority to, PCT Application No. PCT/CN2011/082425, filed on Nov. 18, 2011, entitled "SEMICONDUCTOR DEVICE", which claims priority to Chinese Application No. 201110241218.2, filed on Aug. 22, 2011. Both the PCT Application and Chinese Application are incorporated herein by reference in their entireties.

TECHNICAL FIELD

The present disclosure relates to semiconductor technology, and more particularly, to a semiconductor device with a back gate.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases.

As the MOSFETs are scaled down, gates also have reduced effective length, so that when a gate voltage is applied, fewer charges may be controlled by the gate voltage in a depletion region. Consequently, threshold voltages of the MOSFETs may drop down with the decreasing of the channel length.

Subthreshold swing (also called S factor) is an important parameter when the MOSFETs operate as logic switches in a subthreshold state during operation. The S factor is defined as: S=dVgs/d(log 10 Id), and the unit is [mV/decade]. S factor has a value equal to a gate voltage increment ΔVgs required to change drain current Id by an order of magnitude. It represents a slope of Id-Vgs curve. The value of S factor depends on device structure and temperature, etc. At the room temperature, the S factor has a theoretical minimum of 60 mV/decade.

As the MOSFETs are scaled down, subthreshold characteristics, which are characterized by S factor, will also degrade. Consequently, a leakage current occurs so that the gate loses control of the drain current.

In order to suppress the short channel effects, an SOI (semiconductor-on-insulator) wafer may be used in manufacturing the MOSFETs. For example, a semiconductor layer of the SOI wafer can have a thickness smaller than 20 nm, which then provides an ultra-thin channel. Hence, the control of charges by the gate voltage in a depletion layer of the ultra-thin channel is enhanced.

However, the ultra-thin channel brings a new technical challenge. The threshold voltage is remarkably changed by thickness variation of the ultra-thin channel. Thus, the thickness of the semiconductor layer in the SOI MOSFETs should be accurately controlled for the desired threshold voltage, which may cause difficulty in manufacturing process.

SUMMARY OF THE DISCLOSURE

The object of the present disclosure is to provide a semiconductor device which has a back gate for alleviating threshold voltage fluctuation.

According to one aspect of the present invention, there is provided a semiconductor device comprising a source region and a drain region formed in an ultra-thin semiconductor layer; a channel region formed between the source region and the drain region in the ultra-thin semiconductor layer; a front gate stack above the channel region, the front gate comprising a front gate and a front gate dielectric between the front gate and the channel region; and a back gate stack below the channel region, the back gate stack comprising a back gate and a back gate dielectric between the back gate and the channel region, wherein the front gate is made of a high-threshold voltage (Vt) material, and the back gate is made of a low-Vt material.

Preferably, the high-Vt material is an N-type metal or a P-type metal.

Preferably, the N-type metal comprises at least one selected from a group consisting of rare-earth elements and group IIIB elements.

Preferably, the P-type metal comprises at least one selected from a group consisting of group IIIA elements.

Preferably, the high-Vt material has the same conductivity type as that of the semiconductor device.

Preferably, the low-Vt material comprises silicides.

According to another aspect of the present invention, there is provided a semiconductor device comprising a source region and a drain region in an ultra-thin semiconductor layer; a channel region between the source region and the drain region in the ultra-thin semiconductor layer; a front gate stack above the channel region, the front gate comprising a front gate and a front gate dielectric between the front gate and the channel region; and a back gate stack below the channel region, the back gate stack comprising a back gate and a back gate dielectric between the back gate and the channel region, wherein the front gate and the back gate are made of the same material, and the back gate is applied with a forward bias voltage during operation.

The semiconductor device utilizes a suitable material combination of the front gate and the back gate and/or the back gate which is applied with a forward bias voltage to change a surface potential $\phi_{sp}$ of the front gate with respect to the back gate. Thus, an impact of varied thickness of the ultra-thin semiconductor layer on the threshold voltage of the semiconductor device is alleviated or even canceled.

DETAILED DESCRIPTION

Exemplary embodiments of the present disclosure will be described in more details below with reference to the accompanying drawings. For the sake of clarity, various components in the attached drawings are not drawn to scale.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential, but can be varied in specific implementation of the disclosure. Unless the context clearly indicates otherwise, each part of the semiconductor device can be made of material(s) well known to one skilled person in the art.

<First Embodiment>

Figure 1:
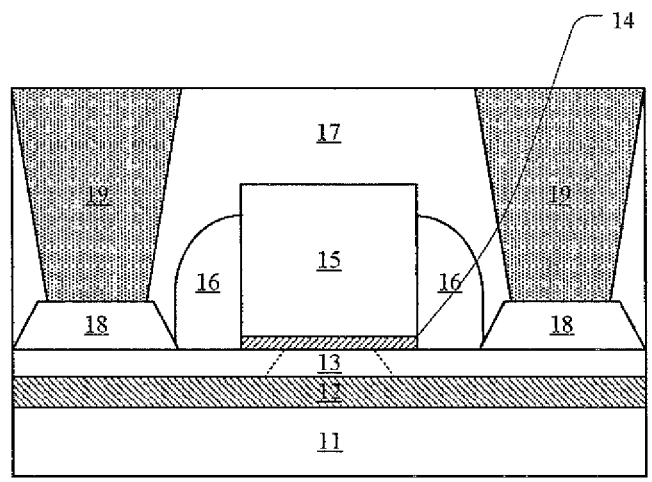
FIG. 1 shows a cross sectional view of an illustrative structure of a semiconductor device according to the present disclosure.

FIG. 1 shows a cross sectional view of an illustrative structure of a semiconductor device according to the present disclosure. The semiconductor device comprises source/drain regions and a channel region between the source/drain regions, which are all formed in an ultra-thin semiconductor layer 13. Boundaries between the channel region and the source/drain regions are indicated by broken lines in the figure. A front gate stack, which includes a front gate dielectric 14 on the ultra-thin semiconductor layer 13 and a front gate 15 on the front gate dielectric 14, is formed above the channel region. Sidewall spacers 16 are formed on both sides of the front gate stack. Conductive vias 19 are formed through an interlayer dielectric layer 17 to reach the source/drain regions, and are electrically coupled with the source/drain regions. A back gate dielectric 12 and a back gate 11 are formed below the ultra-thin semiconductor layer 13. The back gate dielectric 12 is sandwiched between the ultra-thin semiconductor layer 13 and the back gate 11.

Preferably, the semiconductor device as shown in FIG. 1 can be formed from an SOI wafer. The SOI wafer includes a semiconductor substrate, a buried insulating layer and a semiconductor layer from bottom to top, for forming the back gate 11, the back gate dielectric 12 and the ultra-thin semiconductor layer 13, respectively.

Then, the front gate stack, the interlayer dielectric layer 17 and the conductive vias 19 which extend through the interlayer dielectric layer 17 are formed on the SOI wafer by a conventional semiconductor process.

In a case where the SOI wafer is used, the ultra-thin semiconductor layer 13 may have a thickness of about 5 nm to about 20 nm, such as 10 nm or 15 nm. Moreover, the buried insulating layer 12 may have a thickness of about 5 nm to about 30 nm, such as 10 nm, 15 nm, 20 nm or 25 nm.

The ultra-thin semiconductor layer 13 may be made of a semiconductor material selected from a group consisting of group-IV semiconductors (such as silicon, germanium or silicon germanium) and group III-V compound semiconductors (such as gallium arsenide). In this embodiment, the ultra-thin semiconductor layer 13 is made of single-crystal silicon. The back gate dielectric 12 may be a buried oxide layer, a buried oxynitride layer or other buried insulating layer.

The front gate dielectric 14 may be made of one of oxides, oxynitrides and high-K materials (such as, at least one of $HfO_2$, HfSiO, HfSiON, HfTaO, HfTiO, HfZrO, $Al_2O_3$, $La_2O_3$, $ZrO_2$ and LaAlO), or any combination thereof.

Preferably, an epitaxial layer 18 may be formed outside the front stack above the ultra-thin semiconductor layer 13. The combination of the ultra-thin semiconductor layer 13 and the epitaxial layer 18 forms raised source/drain regions with respect to the channel region, which reduces on-state resistance and power consumption of the semiconductor device.

In a case where the raised source/drain regions are formed, the epitaxial semiconductor layer 18 and the ultra-thin semiconductor layer 13 may be preferably made of the same material.

According to the first embodiment of the present invention, the front gate 15 and the back gate 11 are made of different materials. The front gate 15 is applied with a forward bias voltage and the back gate 11 is floating during operation.

The front gate 15 is made of a high-threshold voltage (Vt) material. The high-Vt material may be a metal which has the same conductivity type as that of the semiconductor device. The metal with a certain conductivity type means that its Fermi level is approximate to a semiconductor with the same conductivity type. For example, an N-type metal may be one selected from a group consisting of rare-earth elements, such as La, Ce, or Er, and group IIIB elements, such as Sc; and a P-type metal may be one selected from IIIA elements, such as Ga, Al, or In.

The back gate 11 is made a low-Vt material. The low-Vt material may be silicides, such as NiSi, CoSi, TiSi, or TaSi.

Figure 2:
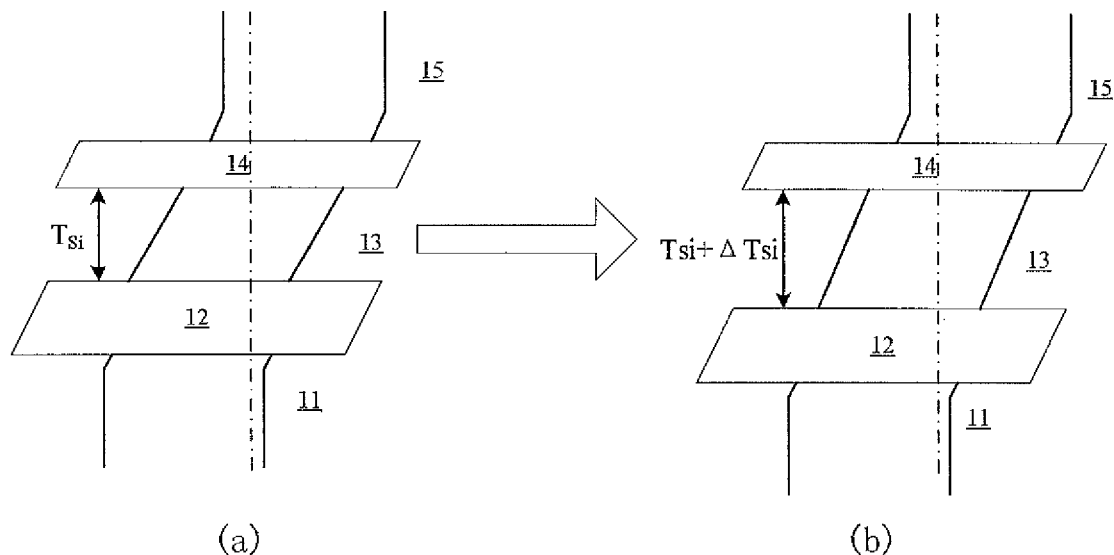
FIG. 2 shows an energy band diagram in a vertical direction of the semiconductor device according to the present disclosure.

FIG. 2 shows an energy band diagram in a vertical direction of the semiconductor device according to the present disclosure. It illustrates how the threshold voltage of the semiconductor device is affected by an increased thickness of the ultra-thin semiconductor layer 13 from $T_{Si}$ to $T_{Si}+\Delta T_{Si}$.

The threshold voltage of the semiconductor device is calculated according to the following formula:

$$\Delta Vt \propto (\phi_f-\phi_b)*\Delta T_{Si}/(T_f+T_b+T_{Si})-(\phi_f-E_{fc})*\Delta T_{Si}/(T_f+T_{Si}),$$

wherein $\phi_f$ and $\phi_b$ are work functions of the front gate and the back gate, respectively, $E_{fc}$ is Fermi level of the channel region, $T_f$ and $T_b$ are "equivalent thicknesses" (corresponding to normalized relative dielectric constants) of the front gate dielectric and the back gate dielectric, respectively.

On one hand, when the thickness of the ultra-thin semiconductor layer 13 increases by $\Delta T_{Si}$, the control capability of gate voltage declines, and subthreshold characteristics which is characterized by S factor degrades, resulting in a reduced threshold voltage. On the other hand, when the thickness of the ultra-thin semiconductor layer 13 increases by $\Delta T_{Si}$, a surface potential $\phi_{sp}$ of the front gate 15 with respect to the back gate 11 increases, resulting in an increased threshold voltage. Thus, in a case where the front gate 15 is made of a high-Vt material and the back gate 11 is made of a low-Vt material, an impact of the increased thickness of the ultra-thin semiconductor layer 13 on the threshold voltage of the semiconductor device is alleviated.

Although it is not shown, in a case where the thickness of the ultra-thin semiconductor layer 13 is decreased from $T_{Si}$ to $T_{Si}-\Delta T_{Si}$, the combination of the front gate 15 and the back gate 11 according to the present embodiment lowers the surface potential $\phi_{sp}$ of the front gate 15 with respect to the back gate 11. Thus, an impact of the decreased thickness of the ultra-thin semiconductor layer 13 on the threshold voltage of the semiconductor device is also alleviated.

A suitable material combination of the front gate 15 and the back gate 11 will even cancel the impact of the varied thickness of the ultra-thin semiconductor layer 13 on the threshold voltage of the semiconductor device, which satisfies: $dV_t/dT_{Si}=0$, wherein $V_t$ is the threshold voltage of the semiconductor device, $T_{Si}$ is the thickness of the ultra-thin semiconductor layer.

<Second Embodiment>

According to the second embodiment of the present invention, the front gate 15 and the back gate 11 are made of the same material. However, the front gate 15 is applied with a forward bias voltage, and the back gate 11 is also applied with a forward bias voltage during operation.

According to the present embodiment, in a case where the thickness of the ultra-thin semiconductor layer 13 varies, the forward bias voltage applied to the back gate 11 changes the surface potential $\phi_{sp}$ of the front gate 15 with respect to the back gate 11. Thus, an impact of the varied thickness of the ultra-thin semiconductor layer 13 on the threshold voltage of the semiconductor device is alleviated or even canceled.

<Third Embodiment>

According to the third embodiment of the present invention, the front gate 15 is made of the high-Vt material and the back gate 11 is made of the low-Vt material. Moreover, the front gate 15 is applied with a forward bias voltage, and the back gate 11 is also applied with a forward bias voltage during operation.

According to the present embodiment, in a case where the thickness of the ultra-thin semiconductor layer 13 varies, the surface potential $\phi sp$ of the front gate 15 with respect to the back gate 11 may be changed not only by the material combination of the front gate 15 and the back gate 11, but also by the forward bias voltage applied to the back gate 11. Thus, an impact of the varied thickness of the ultra-thin semiconductor layer 13 on the threshold voltage of the semiconductor device is alleviated or even canceled.

While the disclosure has been described with reference to specific embodiments, the description is illustrative of the disclosure. The description is not to be considered as limiting the invention. The description is not to be considered as limiting the disclosure.

We claim:

1. A semiconductor device, comprising:
    a source region and a drain region formed in an ultra-thin semiconductor layer;
    a channel region formed between the source region and the drain region in the ultra-thin semiconductor layer;
    a front gate stack above the channel region, the front gate stack comprising:
        a front gate and a front gate dielectric between the front gate and the channel region; and
        a back gate stack below the channel region, the back gate stack comprising a back gate and a back gate dielectric between the back gate and the channel region,
        wherein the front gate is made of a high-threshold voltage (Vt) material, and the back gate is made of a low-Vt material, and
        wherein in a case where the semiconductor device is an N-type device, the high-Vt material comprises an N-type metal whose Fermi level is approximate to that of an N-type semiconductor or in a case where the semiconductor device is a P-type device, the high-Vt material comprises a P-type metal whose Fermi level is approximate to that of a P-type semiconductor.

2. The semiconductor device according to claim 1, wherein the N-type metal comprises at least one selected from a group consisting of rare-earth elements and group IIIB elements.

3. The semiconductor device according to claim 1, wherein the P-type metal comprises at least one selected from a group consisting of group IIIA elements.

4. The semiconductor device according to claim 1, wherein the high-Vt material has the same conductivity type as that of the semiconductor device.

5. The semiconductor device according to claim 1, wherein the low-Vt material comprises silicides.

6. The semiconductor device according to claim 1, wherein the ultra-thin semiconductor layer is a semiconductor layer of an SOI wafer.

7. The semiconductor device according to claim 1, wherein the ultra-thin semiconductor layer has a thickness of about 5-20 nm.

8. The semiconductor device according to claim 1, wherein the source region and the drain region each comprise a portion formed in the ultra-thin semiconductor layer and a portion formed in an epitaxial layer on the ultra-thin semiconductor layer.

9. A method of operating a semiconductor device according to claim 1, comprising:
    electrically floating or applying a forward bias voltage to the back gate of the semiconductor device, to make a threshold voltage of the semiconductor device substantially the same irrespective of variations in thickness of the ultra-thin semiconductor layer included in the semiconductor device.

10. A method of operating a semiconductor device, the semiconductor device comprising:
    a source region and a drain region in an ultra-thin semiconductor layer;
    a channel region between the source region and the drain region in the ultra-thin semiconductor layer;
    a front gate stack above the channel region, the front gate comprising:
        a front gate and a front gate dielectric between the front gate and the channel region; and
        a back gate stack below the channel region, the back gate stack comprising a back gate and a back gate dielectric between the back gate and the channel region,
        wherein the front gate and the back gate are made of the same material, the method comprises applying a forward bias voltage to the back gate of the semiconductor device during operation, to make a threshold voltages of the semiconductor device substantially the same irrespective of variations in thickness of the ultra-thin semiconductor layers included in the semiconductor device.

11. The method according to claim 10, wherein the ultra-thin semiconductor layer is a semiconductor layer of an SOI wafer.

12. The method according to claim 10, wherein the ultra-thin semiconductor layer has a thickness of about 5-20 nm.

13. The method according to claim 10, wherein the source region and the drain region each comprise a portion formed in the ultra-thin semiconductor layer and a portion formed in an epitaxial layer on the ultra-thin semiconductor layer.

14. The semiconductor device according to claim 2, wherein the high-Vt material has the same conductivity type as that of the semiconductor device.

15. The semiconductor device according to claim 3, wherein the high-Vt material has the same conductivity type as that of the semiconductor device.

* * * * *